(12) United States Patent
An (10) Patent No.: US 11,177,157 B2
(45) Date of Patent: Nov. 16, 2021

(54) METHOD FOR CONSTRUCTING MICRO-LED DISPLAY MODULE

(71) Applicant: LUMENS CO., LTD., Yongin-si (KR)

(72) Inventor: Kihyun An, Yongin-si (KR)

(73) Assignee: LUMENS CO., LTD., Yongin-si (KR)

( * ) Notice: Subject to any disclaimer, the term of this patent is extended or adjusted under 35 U.S.C. 154(b) by 35 days.

(21) Appl. No.: 16/794,601

(22) Filed: Feb. 19, 2020

(65) Prior Publication Data

US 2020/0294976 A1    Sep. 17, 2020

(30) Foreign Application Priority Data

Mar. 15, 2019 (KR) .................. 10-2019-0029596

(51) Int. Cl.
| | |
|---|---|
| *H01L 21/687* | (2006.01) |
| *H01L 25/075* | (2006.01) |
| *H01L 23/00* | (2006.01) |
| *H01L 21/683* | (2006.01) |
| *H01L 21/60* | (2006.01) |

(52) U.S. Cl.
CPC ........ *H01L 21/687* (2013.01); *H01L 21/6838* (2013.01); *H01L 21/68714* (2013.01); *H01L 21/68785* (2013.01); *H01L 24/75* (2013.01); *H01L 24/81* (2013.01); *H01L 24/95* (2013.01); *H01L 25/0753* (2013.01); *H01L 2021/6015* (2013.01); *H01L 2021/60097* (2013.01); *H01L 2224/75251* (2013.01); *H01L 2224/75263* (2013.01); *H01L 2224/81224* (2013.01); *H01L 2224/81815* (2013.01); *H01L 2924/3511* (2013.01)

(58) Field of Classification Search
CPC ........ H01L 24/10; H01L 24/11; H01L 24/95; H01L 2021/60097; H01L 2021/6015; H01L 2021/60195; H01L 21/687; H01L 21/68714; H01L 21/68785; H01L 2224/75251; H01L 2224/75265; H01L 2224/75981; H01L 2224/75743; H01L 2224/75744; H01L 25/0753; H01L 21/6838; H01L 24/81; H01L 24/75; H01L 2924/3511; H01L 2224/81815; H01L 2224/81224; H01L 2224/75263
See application file for complete search history.

(56) References Cited

U.S. PATENT DOCUMENTS

| | | | |
|---|---|---|---|
| 8,575,758 B2 * | 11/2013 | West | H01L 21/568 |
| | | | 257/774 |
| 8,722,436 B2 * | 5/2014 | Chern | H01L 23/49513 |
| | | | 438/28 |

(Continued)

*Primary Examiner* — Eduardo A Rodela
(74) *Attorney, Agent, or Firm* — Mei & Mark LLP (57) ABSTRACT

Disclosed is a method for constructing a micro-LED display module. The method includes: retaining micro-LED chips in a matrix on a chip retaining member; picking up the micro-LED chips on the chip retaining member and transferring the picked up micro-LED chips to a planar carrier member; pressing the micro-LED chips on the planar carrier member against a mount substrate; and heating solders disposed on the mount substrate above the melting point of the solders simultaneously with the pressing of the micro-LED chips against the mount substrate to bond the micro-LED chips to the mount substrate. The mount substrate is sucked by a suction chuck during heating of the solders.

20 Claims, 8 Drawing Sheets

(56) References Cited

U.S. PATENT DOCUMENTS

| | | | |
|---|---|---|---|
| 2002/0067982 A1* | 6/2002 | Yasumura | H01L 21/6838 414/589 |
| 2005/0274003 A1* | 12/2005 | Lee | H01L 21/6838 29/743 |
| 2006/0011711 A1* | 1/2006 | Mino | B23K 1/012 228/180.22 |
| 2011/0280703 A1* | 11/2011 | Cadee | G03F 7/7075 414/806 |
| 2013/0260534 A1* | 10/2013 | Khanna | H01L 24/75 438/457 |
| 2016/0190088 A1* | 6/2016 | Yu | H01L 21/67144 438/107 |
| 2019/0360673 A1* | 11/2019 | Seo | H01L 33/483 |
| 2020/0194401 A1* | 6/2020 | Ma | B23K 3/08 |
| 2021/0043816 A1* | 2/2021 | Bower | H01L 24/00 |

* cited by examiner

METHOD FOR CONSTRUCTING MICRO-LED DISPLAY MODULE

BACKGROUND OF THE INVENTION

1. Field of the Invention

The present invention relates to a method for constructing a micro-LED display module, and more specifically to a method for constructing a micro-LED display module based on transfer printing.

2. Description of the Related Art

A number of micro-LED chips need to be mounted on a mount substrate such as a printed circuit board (PCB) for efficient construction of a micro-LED module for a micro-LED display panel.

According to a known technique for efficient mounting of micro-LED chips, a plurality of micro-LED chips arranged in a matrix on a chip retaining film are transferred at one time to a mount substrate, on which solders (or pairs of solders) are previously disposed corresponding to the micro-LED chips, by a roll-to-roll process and are then mounted on the mount substrate during heating of the solders by a reflow process.

However, the transfer of the micro-LED chips from the chip retaining film to the mount substrate and the bonding of the micro-LED chips to the mount substrate through the solders are performed separately in different systems, resulting in low throughput. Despite its many advantages, the roll-to-roll process is limited in that the number of defects is not greatly reduced.

SUMMARY OF THE INVENTION

In view of this, substantially simultaneous transfer and bonding of micro-LED chips to a mount substrate during heating of solders will lead to an increase in production efficiency. It was, however, found that when transfer and chip bonding are performed simultaneously, the mount substrate is bent by thermal expansion at a solder heating temperature, resulting in dislocation of the micro-LED chips and the solders.

One object of the present invention is to provide a method for constructing a micro-LED display module in which micro-LED chips retained on a chip retaining member are transferred to a mount substrate using a planar carrier member and solders are heated simultaneously with the transfer of the micro-LED chips to bond the micro-LED chips to the mount substrate such that thermal expansion of the mount substrate caused by a temperature rise during heating of the solders is physically suppressed, enabling reliable transfer and bonding of the micro-LED chips.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE INVENTION

Preferred embodiments of the present invention will now be described in detail with reference to the accompanying drawings.

First Embodiment

Figure 1:
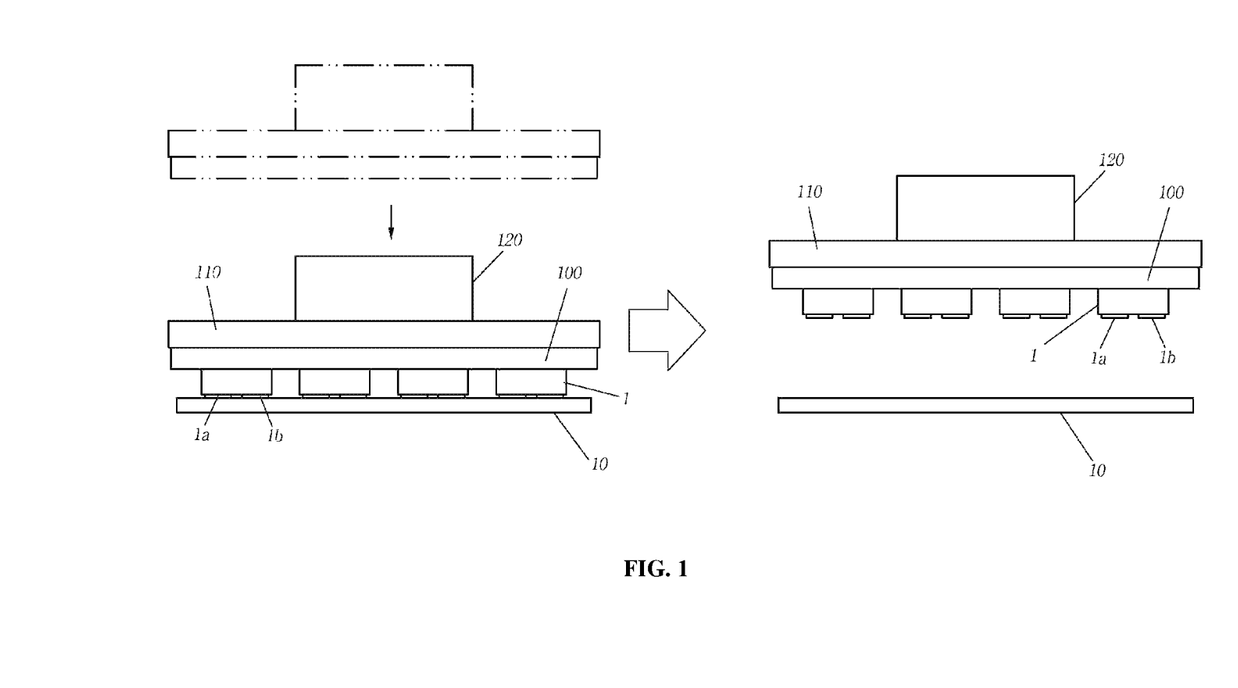
FIG. 1 illustrates a process for picking up micro-LED chips from a chip retaining film by a planar carrier member according to a first embodiment of the present invention.
Figure 2:
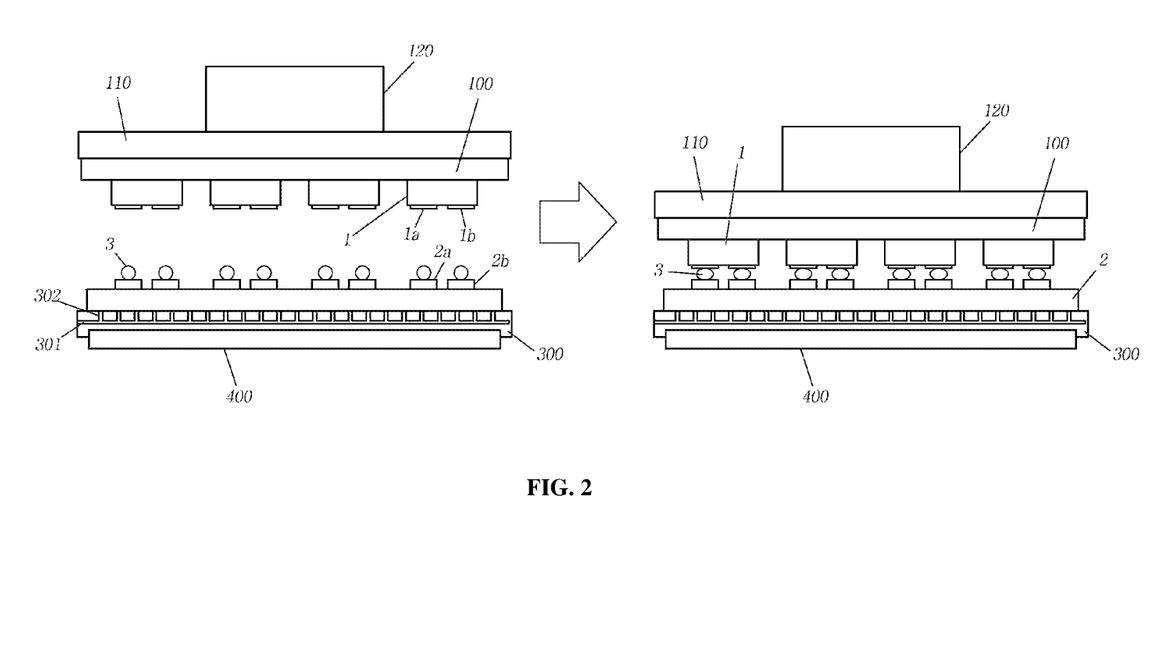
FIG. 2 illustrates a process for transferring and bonding the micro-LED chips picked up by the planar carrier member to a mount substrate according to the first embodiment of the present invention.

FIG. 1 illustrates a process for picking up micro-LED chips from a chip retaining film by a planar carrier member according to a first embodiment of the present invention and FIG. 2 illustrates a process for transferring and bonding the micro-LED chips picked up by the planar carrier member to a mount substrate.

Referring to FIG. 1, micro-LED chips 1 are attached in an array to a chip retaining member 10 in the form of a film.

Each of the micro-LED chips 1 is a flip-chip type micro-LED chip including a first electrode pad 1a electrically connected to a first conductive semiconductor layer and a second electrode pad 1b electrically connected to a second conductive semiconductor layer on the lower surface thereof, but is not limited to this type. Alternatively, each of the micro-LED chips 1 may be of a vertical type. The first electrode pads 1a and the second electrode pads 1b of the micro-LED chips 1 are in contact with the chip retaining member 10 and the upper surfaces of the micro-LED chips 1 are opposed to the chip retaining member. The chip retaining member 10 includes an adhesive on one surface thereof.

A planar carrier member is used to pick up the micro-LED chips 1 arrayed on the chip retaining member 10 and transfer the picked up micro-LED chips 1 to the mount substrate. A quartz plate 100 is used as the planar carrier member. An adhesive is provided on the lower surface of the quartz plate 100. Preferably, a chuck 110 holds the quartz plate 100 by vacuum to maintain the quartz plate 100 in a horizontal position and an actuator 120 coupled to the upper portion of the chuck 110 is operated such that the quartz plate 100 moves up and down. The chuck 110 may be a vacuum chuck. By the operation of the actuator 120, the quartz plate 100 can be pressed against the chip retaining member 10 or a mount substrate, which will be described later. An adhesive is provided on the lower surface of the quartz plate 100 to bond the micro-LED chips 1 to the quartz plate 100.

Referring to FIG. 2, the micro-LED chips 1 attached in an array to the lower surface of the quartz plate 100 are transferred and bonded to a mount substrate 2 while maintaining their array. The mount substrate 2 may be, for example, a PCB.

The mount substrate 2 includes first electrodes 2a and second electrodes 2b corresponding to the first electrode pads 1a and the second electrode pads 1b of the micro-LED chips 1 on the upper surface thereof, respectively. A solder 3 is previously placed on each of the first electrodes 2a and the second electrodes 2b. The solders 3 may be SAC solders.

The actuator 120 is operated in a state in which the centers of the first electrode pads 1a and the second electrode pads 1b coincide with the centers of the first electrodes 2a and the second electrodes 2b, respectively, such that the quartz plate 100 fixed to the chuck 110 moves downward. By the operation of the actuator 120, the micro-LED chips 1 attached to the quartz plate 100 are loaded on the mount substrate 2. The solders 3 interposed between the electrode pads 1a and 1b and the electrodes 2a and 2b are heated to about 240 to about 290° C. equal to or higher than their melting point, and at the same time, the micro-LED chips 1 are pressed against the mount substrate 2 to bond the electrode pads 1a and 1b to the electrodes 2a and 2b through the solders 3.

Since the mount substrate 2 is based on a porous ceramic material that undergoes thermal expansion deformation at about 160° C., the mount substrate 2 tends to be bent at the solder heating temperature. According to this embodiment, the bending of the mount substrate 2 is prevented by a suction chuck 300 having a plurality of suction holes 302 in contact with the lower surface of the mount substrate 2 and sucking the mount substrate 2 through the suction holes 302 to suppress thermal expansion deformation of the mount substrate 2. The plurality of suction holes 302 can be connected to an air passage 301 connected to a vacuum pump. The plurality of suction holes 302 are widely distributed so as to cover the entire lower surface of the mount substrate 2. The density of the suction holes 302 in areas corresponding to regions of the mount substrate 2 where large thermal deformation occurs is made larger than that of the suction holes of the other areas. This allows the mount substrate 2 to better cope with local and section-wise deformation.

A heater 400 is used as means for heating the solders 3. The heater 400 is installed in thermal contact with the suction chuck 300. Heat generated from the heater 400 is applied to the mount substrate 2 through the suction chuck 300 or is directly applied to the mount substrate 2 such that the solders 3 placed on the electrodes of the mount substrate 2 are heated above a predetermined temperature.

The micro-LED chips 1 are loaded and bonded by the following procedure. First, the quartz plate 100 is allowed to descend to press the micro-LED chips 1 against the surface of the mount substrate 2 in a state in which the mount substrate 2 is sucked by the suction chuck 300 to suppress deformation of the mount substrate 2. Then, the heater 400 is operated to heat the solders 3. Thereafter, the operation of the heater 400 is stopped such that the mount substrate 2 is cooled to less than a temperature at which thermal deformation begins. Then, the suction action of the suction chuck 300 is released to stop the suction of the mount substrate 2 performed by the suction chuck 300. In the course of heating the solders 3, thermal expansion deformation of the mount substrate 2 can be strongly suppressed by the suction force of the suction chuck 300 and the pressing force of the quartz plate 100 against the mount substrate 2. Next, the quartz plate 100 is detached from the micro-LED chips 1 by raising the quartz plate 100.

This simultaneous transfer and bonding of the micro-LED chips 1 to the mount substrate 2 contributes to an increase in productivity. In the absence of the suction chuck 300, deformations of the mount substrate 2 are found at distances of about 80 μm from both ends thereof. These deformations make the bonding of the very small micro-LED chips 1 difficult. Even if bonded to the mount substrate 2, the mount substrate 2 is not made flat, causing problems in color uniformity. In contrast, the use of the suction chuck 300 in this embodiment suppresses thermal deformation of the mount substrate 2, enabling precise bonding of the micro-LED chips 1 without causing the above problems. The actuator 120 allows precise control over the position of the quartz plate 100. It is also contemplated that a vision camera is installed above the quartz plate 100 to precisely control the position of the quartz plate.

Second Embodiment

Figure 3:
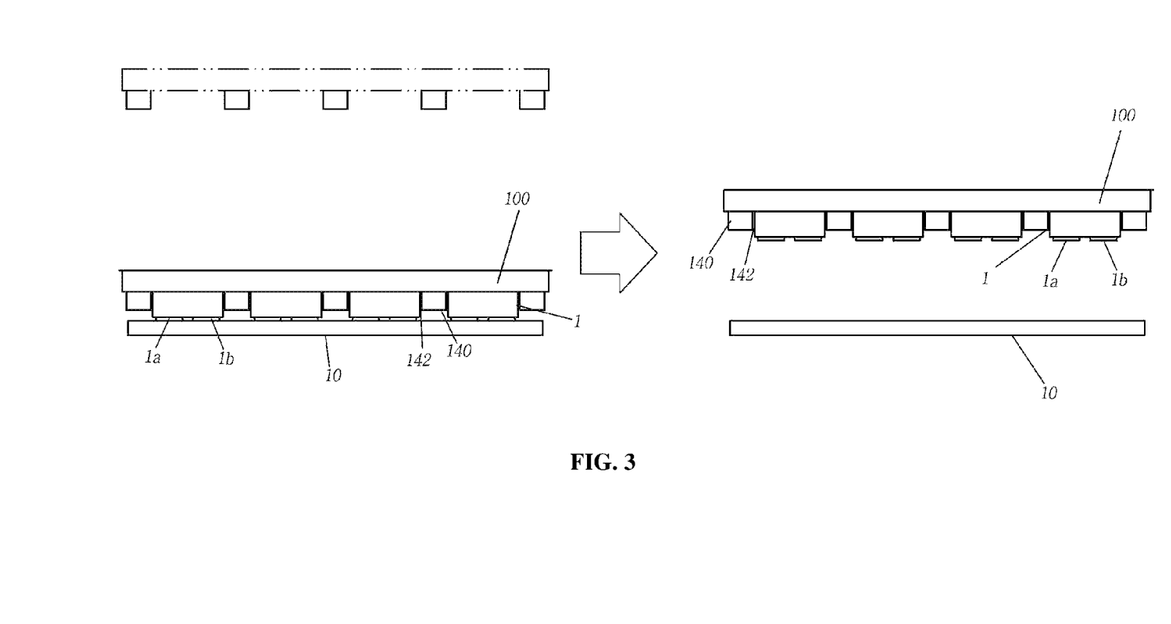
FIG. 3 illustrates a process for picking up micro-LED chips from a chip retaining film by a planar carrier member according to a second embodiment of the present invention.
Figure 4:
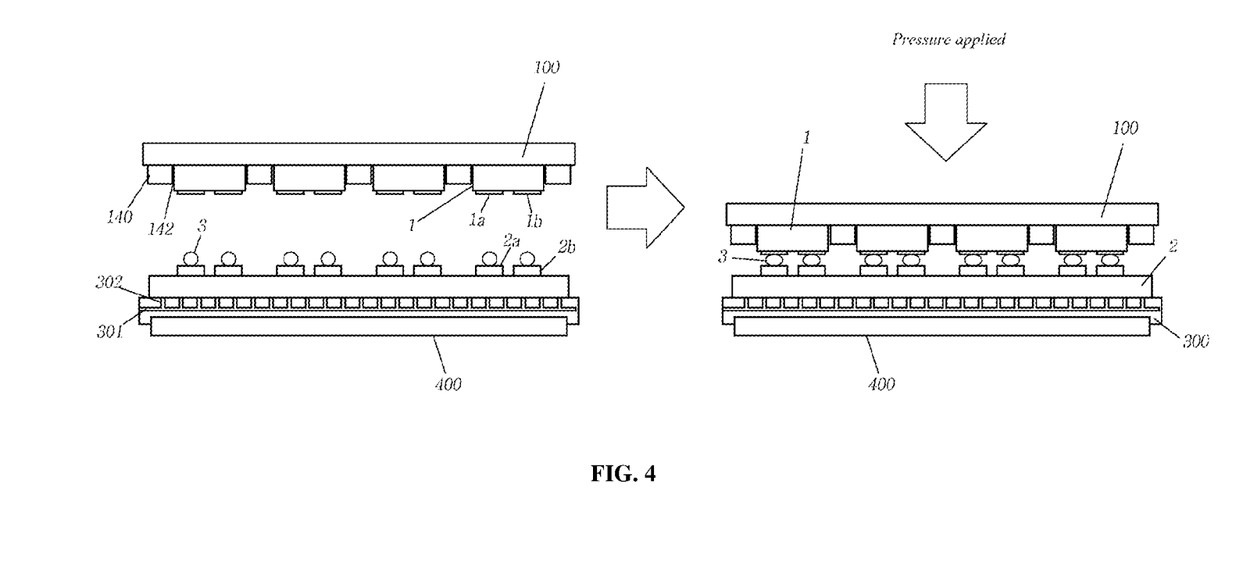
FIG. 4 illustrates a process for transferring and bonding the micro-LED chips picked up by the planar carrier member to a mount substrate according to the second embodiment of the present invention.
Figure 5:
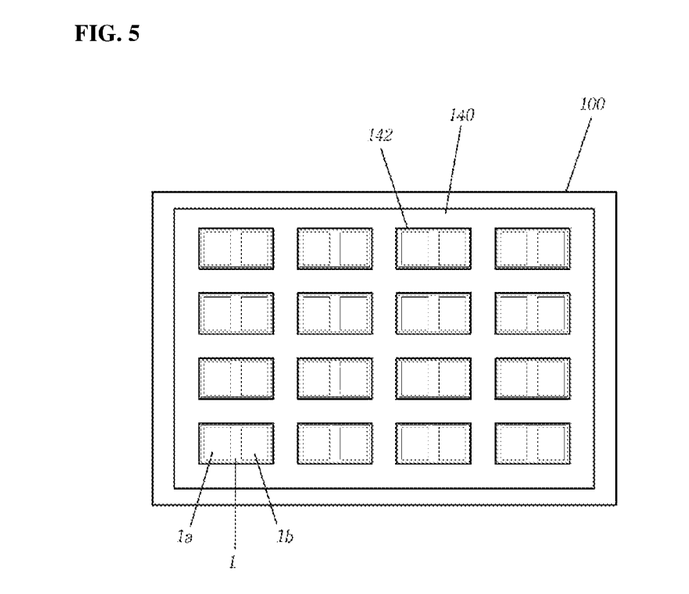
FIG. 5 is a bottom view illustrating a barrier disposed on the planar carrier member illustrated in FIG. 4.

FIG. 3 illustrates a process for picking up micro-LED chips from a chip retaining film by a planar carrier member according to a second embodiment of the present invention, FIG. 4 illustrates a process for transferring and bonding the micro-LED chips picked up by the planar carrier member to a mount substrate, and FIG. 5 is a bottom view illustrating a barrier disposed on the planar carrier member illustrated in FIG. 4.

This embodiment is substantially the same as the first embodiment. Specifically, referring to FIGS. 3 and 4, micro-LED chips 1 are simultaneously transferred and bonded to the mount substrate 2. As in the first embodiment, the micro-LED chips 1 arrayed on a chip retaining member 10 are picked up and transferred to the mount substrate by a planar carrier member. A quartz plate 100 is used as the planar carrier member. An adhesive is provided on the lower surface of the quartz plate 100. Solders 3 are interposed between first electrode pads 1a and second electrode pads 1b of the micro-LED chips 1 and first electrodes 2a and second electrodes 2b of the mount substrate 2. A heater 400 is used as means for heating the solders 3. A suction chuck 300 sucks the lower surface of the mount substrate 2 through a plurality of suction holes 302 to prevent thermal expansion of the mount substrate 2 during heating of the solders 3. The micro-LED chips 1 are bonded to the mount substrate 2 through the following sequential steps: suction, solder heating, cooling, and suction release.

A barrier 140 is disposed on the lower surface of the quartz plate 100, unlike in the first embodiment. The barrier 140 has a mesh structure in which barrier holes 142 surrounding the micro-LED chips 1 are arranged in a matrix, as well illustrated in FIG. 4. The barrier 140 prevents each of the micro-LED chips 1 from being displaced out of its defined range during bonding of the micro-LED chip 1 to the mount substrate 2. The barrier 140 is effective in preventing the micro-LED chips 1 from being tilted.

The movable range of each of the micro-LED chips 1 during soldering can be limited to the distance range between the inner wall of the corresponding barrier hole 142 and the side surface of the micro-LED chip 1. This movable range can be determined within the error range in view of quality control. The thickness of the barrier 140 is made smaller than that of the micro-LED chips 1. The barrier 140 may be provided by forming or attaching a film having a predetermined thickness on the surface of the quartz plate 100 and partially removing the film by a suitable process such as wire cutting or laser cutting to form the barrier holes 142. Alternatively, the barrier may be provided by attaching a mesh film having barrier holes to the lower surface of the quartz plate 100.

Third Embodiment

Figure 6:
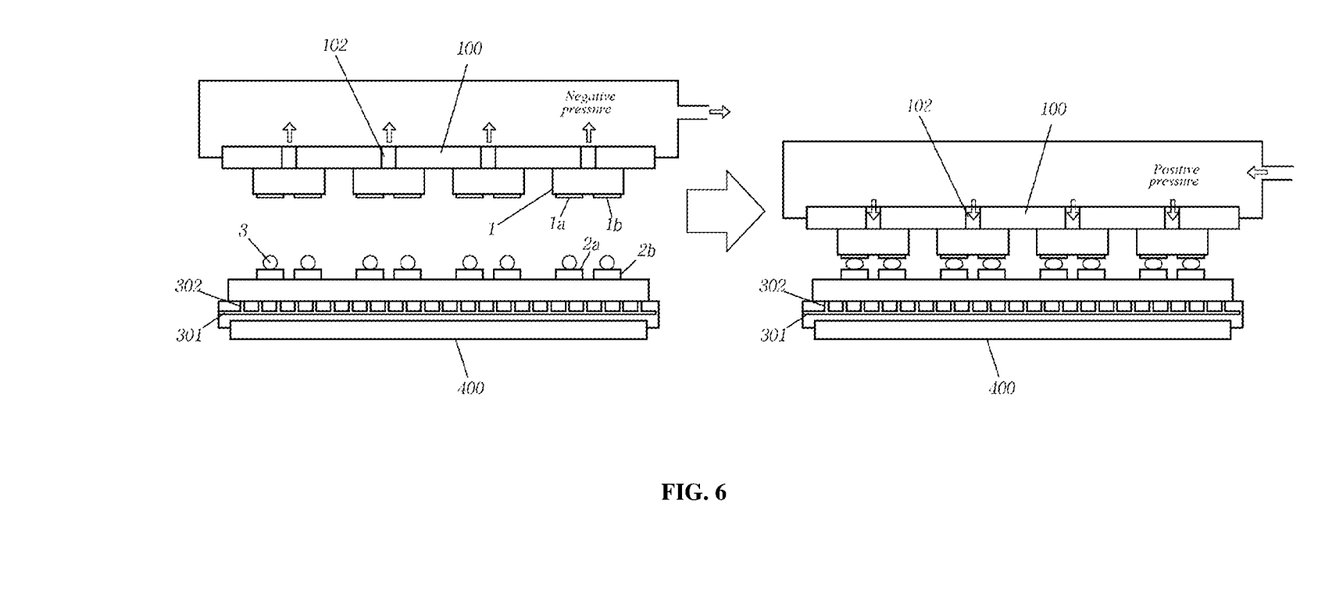
FIG. 6 illustrates a process for transferring and bonding micro-LED chips picked up by a planar carrier member to a mount substrate according to a third embodiment of the present invention.

FIG. 6 illustrates a process for transferring and bonding micro-LED chips picked up by a planar carrier member to a mount substrate according to a third embodiment of the present invention.

Referring to FIG. 6, a quartz plate 100 having a plurality of pneumatic holes 102 formed corresponding to micro-LED chips 1 is used as a planar carrier member. That is to say, the plurality of pneumatic holes 102 are previously formed at locations of the quartz plate 100 where the micro-LED chips 1 are to be attached.

When a negative pressure is created in each of the pneumatic holes 102 closed by the corresponding micro-LED chip 1, the micro-LED chip 1 is attached to the lower surface of the quartz plate 100 by the negative pressure. The use of the quartz plate 100 having the pneumatic holes 102 in which a negative pressure can be created can avoid the need to provide an adhesive on the lower surface of the quartz plate 100, which is required in the foregoing embodiments. However, an adhesive may be further provided on the lower surface of the quartz plate 100. In this case, since the force of the adhesive to attach the micro-LED chips 1 to the quartz plate 100 is the sum of a negative pressure created in the pneumatic holes 102 and the adhesive strength of the adhesive, the micro-LED chips 1 may be more stably attached to the quartz plate 100.

When the micro-LED chips 1 are bonded to the mount substrate 2, the negative pressure is released from the pneumatic holes 102 formed in the quartz plate 100 and a positive pressure is created to press the micro-LED chips 1 against the mount substrate 2. The magnitude of the positive pressure in the pneumatic holes 102 can be finely tuned, enabling more reliable bonding of the micro-LED chips 1. A UV curable adhesive may be further applied to the lower surface of the quartz plate 100. In this case, UV light is irradiated from a UV source (not illustrated) arranged above the quartz plate 100. The UV light passes through the quartz plate 100 to deteriorate the adhesiveness of the adhesive. In each of the foregoing embodiments as well as this embodiment, it is very advantageous that the quartz plate has high transmittance for UV light when it is desired to deteriorate the adhesiveness of the adhesive for easy detachment of the micro-LED chips from the planar carrier member.

The other elements and features of this embodiment are the same as those of the foregoing embodiments.

Fourth Embodiment

Figure 7:
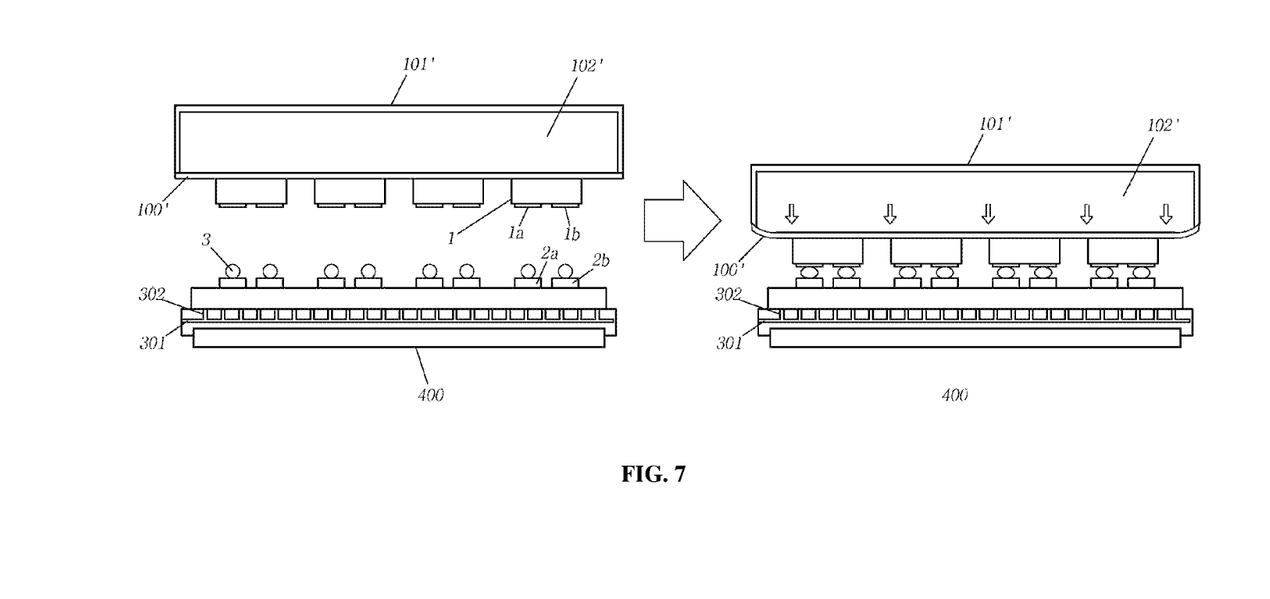
FIG. 7 illustrates a process for transferring and bonding micro-LED chips picked up by a planar carrier member to a mount substrate according to a fourth embodiment of the present invention.

FIG. 7 illustrates a process for transferring and bonding micro-LED chips picked up by a planar carrier member to a mount substrate according to a fourth embodiment of the present invention.

Referring to FIG. 7, a flexible sheet 100' is used as a planar carrier member. The flexible sheet 100' can be coupled to a chamber housing 101' to define a pneumatic chamber 102' with the chamber housing 101'. The flexible sheet 100' may be displaced in response to a change in the internal pressure of the pneumatic chamber 102'. When the internal pressure of the pneumatic chamber 102' increases, the flexible sheet 100' can press micro-LED chips 1 against a mount substrate 2.

The other elements and features of this embodiment are the same as those of the foregoing embodiments.

Fifth Embodiment

Figure 8:
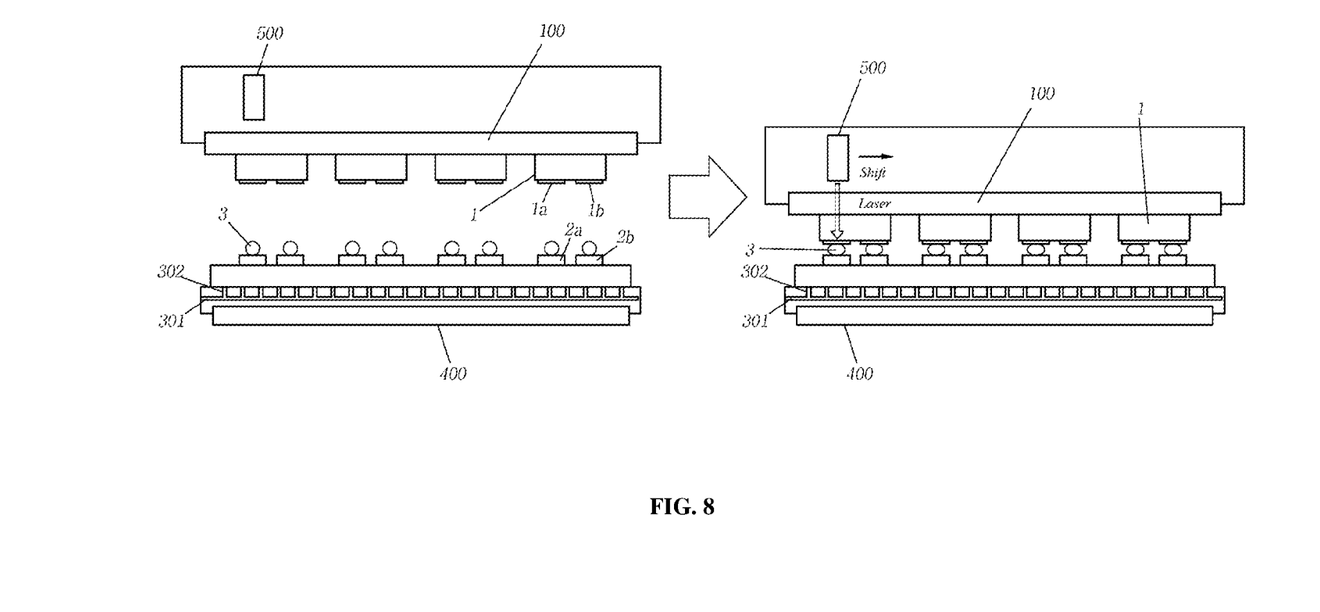
FIG. 8 illustrates a process for transferring and bonding micro-LED chips picked up by a planar carrier member to a mount substrate according to a fifth embodiment of the present invention.

FIG. 8 illustrates a process for transferring and bonding micro-LED chips picked up by a planar carrier member to a mount substrate according to a fifth embodiment of the present invention.

In each of the foregoing embodiments, the solders located on the mount substrate 2 are melted by heating the mount substrate 2 and the solders 3 using the heater 400 only. In contrast, according to this embodiment, solders 3 are preheated to a temperature lower than their melting point using a heater 400 and are then rapidly heated to a temperature equal to or higher than their melting point by irradiation with a laser from a laser irradiation unit 500 installed over a quartz plate 100 as a planar carrier member. The solders 3 can be heated above their melting point by irradiation with a high-power laser but the use of a high-power laser causes serious damage to micro-LED chips 1. Thus, a suction chuck 300 and a mount substrate 2 are heated by the heater 400 for heating the mount substrate 2 below the melting point of the solders 3, and then the solders 3 are rapidly heated above their melting point by irradiation with a low-power laser from the laser irradiation unit 500. The laser is in the form of a line beam rather than a spot. Scanning of the laser in the form of a line beam enables rapid heating of all solders 3 corresponding to the micro-LED chips 1 in a short time.

For example, when the melting point of the solders 3 is 230° C., the solders 3 are preheated to 180-210° C. and the solders 3 located over the entire area of the mount substrate 2 are rapidly heated to about 280° C. higher than their melting point by scanning a line beam laser in one direction. Since a laser can pass through the quartz plate 100, the laser irradiation unit may be arranged over the quartz plate 100. An adhesive may be provided on the quartz plate 100 to attach the micro-LED chips 1 to the quartz plate 100. In this case, a UV source may be arranged over the quartz plate 100 to deteriorate the adhesiveness of the adhesive. The UV source may be designed to be shifted along with the laser irradiation unit 500. This design can prevent interference between the laser irradiation unit 500 and the UV source.

What is claimed is:

1. A method for constructing a micro-LED display module, comprising:
   retaining micro-LED chips in a matrix on a chip retaining member;
   picking up the micro-LED chips on the chip retaining member and transferring the picked up micro-LED chips by a planar carrier member;
   pressing the micro-LED chips on the planar carrier member against a mount substrate; and
   heating solders disposed on the mount substrate above the melting point of the solders simultaneously with the pressing of the micro-LED chips against the mount substrate to bond the micro-LED chips to the mount substrate,
   wherein the mount substrate is sucked by a suction chuck during heating of the solders, and
   wherein after the mount substrate is sucked by the suction chuck, the solders are heated to a temperature equal to or higher than their melting point, the temperature of the mount substrate is reduced to less than the thermal expansion temperature of the mount substrate, and the sucking of the mount substrate performed by the suction chuck is stopped.

2. The method according to claim 1, wherein the solders are heated to a temperature equal to or higher than their melting point using a heater connected to the suction chuck in a state in which the mount substrate is sucked by the suction chuck.

3. The method according to claim 1, wherein the solders are heated to a temperature equal to or higher than their melting point.

4. The method according to claim 1, wherein a barrier is disposed on the lower surface of the planar carrier member to prevent the displacement of the micro-LED chips.

5. The method according to claim 4, wherein the barrier has a mesh structure in which barrier holes surrounding the micro-LED chips are arranged in a matrix.

6. The method according to claim 4, wherein the barrier is provided by forming a film having a predetermined thickness on the lower surface of the planar carrier member and removing portions of the film corresponding to the micro-LED chips.

7. The method according to claim 1, wherein an adhesive is provided on one surface of the planar carrier member to attach the micro-LED chips to the planar carrier member.

8. The method according to claim 7, wherein the adhesiveness of the adhesive is deteriorated by UV light.

9. The method according to claim 1, wherein the planar carrier member is a quartz plate on which an adhesive is provided whose adhesiveness is deteriorated by UV light.

10. The method according to claim 1, wherein the planar carrier member comprises a plurality of pneumatic holes formed corresponding to the micro-LED chips, wherein when a negative pressure is created in the pneumatic holes, the micro-LED chips are attached to the planar carrier member, and wherein when a positive pressure is created in the pneumatic holes, the micro-LED chips are detached from the planar carrier member.

11. The method according to claim 1, wherein the planar carrier member comprises pneumatic holes through which the micro-LED chips are sucked by the creation of a negative pressure and an adhesive through which the micro-LED chips are attached to the planar carrier member by the adhesive strength of the adhesive, and the adhesive is a material whose adhesiveness is deteriorated by UV light.

12. The method according to claim 1, wherein the solders are heated to a temperature equal to or higher than their melting point by scanning a laser in the form of a line beam in one direction to bond the micro-LED chips to the mount substrate.

13. The method according to claim 1, wherein the planar carrier member is made of a material through which a laser is transmitted and a laser passes through the planar carrier member to heat the solders.

14. The method according to claim 1, wherein the solders are preheated to a temperature lower than their melting point using a heater connected to the suction chuck in a state in which the mount substrate is sucked by the suction chuck and are then heated to a temperature equal to or higher than their melting point by irradiation with a laser to bond the micro-LED chips to the mount substrate.

15. A method for constructing a micro-LED display module, comprising:
retaining micro-LED chips in a matrix on a chip retaining member;
picking up the micro-LED chips on the chip retaining member and transferring the picked up micro-LED chips by a planar carrier member;
pressing the micro-LED chips on the planar carrier member against a mount substrate; and
heating solders disposed on the mount substrate above the melting point of the solders simultaneously with the pressing of the micro-LED chips against the mount substrate to bond the micro-LED chips to the mount substrate,
wherein the mount substrate is sucked by a suction chuck during heating of the solders, and
wherein the planar carrier member is a flexible sheet that is displaceable in response to a change in the pressure of a pneumatic chamber.

16. An apparatus for constructing a micro-LED display module, comprising:
a chip retaining member on which micro-LED chips are arrayed in a matrix;
a planar carrier member to which the micro-LED chips arrayed on the chip retaining member are attached;
a heater for heating solders disposed on a mount substrate to bond the micro-LED chips attached to the planar carrier member to the mount substrate; and
a suction chuck disposed between the mount substrate and the heater,
wherein the mount substrate is sucked by the suction chuck during heating of the solders to suppress thermal expansion deformation of the mount substrate;
wherein the planar carrier member comprises pneumatic holes through which the micro-LED chips are sucked by the creation of a negative pressure and an adhesive through which the micro-LED chips are attached to the planar carrier member by the adhesive strength of the adhesive, and the adhesive is a material whose adhesiveness is deteriorated by UV light.

17. The apparatus according to claim 16, wherein a barrier is disposed on the lower surface of the planar carrier member to prevent the displacement of the micro-LED chips.

18. The apparatus according to claim 16, wherein the planar carrier member is a quartz plate on which an adhesive is provided whose adhesiveness is deteriorated by UV light.

19. The apparatus according to claim 16, wherein the planar carrier member comprises a flexible sheet displaceable in response to a change in the pressure of a pneumatic chamber.

20. The apparatus according to claim 16, wherein the planar carrier member is made of a material through which a laser is transmitted to heat the solders.

* * * * *